United States Patent
Sato et al.

(10) Patent No.: US 9,618,537 B2
(45) Date of Patent: Apr. 11, 2017

(54) SHUNT RESISTANCE TYPE CURRENT SENSOR

(71) Applicant: Yazaki Corporation, Tokyo (JP)

(72) Inventors: Takashi Sato, Susono (JP); Shin Umehara, Susono (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/977,761

(22) Filed: Dec. 22, 2015

(65) Prior Publication Data

US 2016/0109484 A1 Apr. 21, 2016

Related U.S. Application Data

(63) Continuation of application No. PCT/JP2014/067089, filed on Jun. 26, 2014.

(30) Foreign Application Priority Data

Jul. 18, 2013 (JP) ................. 2013-149283

(51) Int. Cl.
*G01R 1/20* (2006.01)
*G01R 31/36* (2006.01)
(Continued)

(52) U.S. Cl.
CPC ......... *G01R 1/203* (2013.01); *G01R 19/0092* (2013.01); *G01R 31/3696* (2013.01); *H01C 13/00* (2013.01)

(58) Field of Classification Search
USPC ...... 324/126, 105, 601, 76, 76.11, 522, 713, 324/426, 434, 120, 441, 525, 538, 691;
(Continued)

(56) References Cited

U.S. PATENT DOCUMENTS

2004/0253851 A1 12/2004 Naitou et al.
2005/0090132 A1 4/2005 Miyazaki
(Continued)

FOREIGN PATENT DOCUMENTS

JP 55-11715 U1 7/1978
JP 62-31980 A 2/1987
(Continued)

OTHER PUBLICATIONS

Nakamura et al., Current Detector, Publication No. JP04-083175A; Filing Date:Jul. 25, 1990; Publication Date: Mar. 17, 1992; Mitsubishi Electric Corp.*
(Continued)

*Primary Examiner* — Melissa Koval
*Assistant Examiner* — Nasima Monsur
(74) *Attorney, Agent, or Firm* — Sughrue Mion, PLLC

(57) ABSTRACT

A shunt resistance type current sensor includes a bus bar, a circuit board disposed to oppose the bus bar, a shunt resistance part in the bus bar, connection terminals which electrically connect the bus bar and the circuit board, and a voltage detector which is mounted on the circuit board and detects a voltage applied to the bus bar to detect a magnitude of current to be measured flowing through the bus bar. The connection terminal is formed integrally with the bus bar as an extending piece extended from an edge part of the bus bar, an area of the connection terminal reduced in its plate thickness than that of the bus bar is set in a range from a tip side thereof, and the tip side of the connection terminal penetrates the circuit board and connects with the circuit board.

5 Claims, 10 Drawing Sheets

(51) Int. Cl.
*G01R 19/00* (2006.01)
*H01C 13/00* (2006.01)

(58) Field of Classification Search
USPC ...... 174/260, 261, 520, 68.2, 250, 255, 257;
361/624, 720, 736, 748; 219/541, 497,
219/507; 338/49; 320/152
See application file for complete search history.

(56) References Cited

U.S. PATENT DOCUMENTS

| | | | | |
|---|---|---|---|---|
| 2009/0039836 | A1* | 2/2009 | Asada | G01K 1/14 320/152 |
| 2010/0066351 | A1 | 3/2010 | Condamin et al. | |
| 2010/0271036 | A1* | 10/2010 | Kishimoto | B60L 11/1855 324/434 |
| 2011/0062945 | A1 | 3/2011 | Condamin et al. | |
| 2011/0187346 | A1* | 8/2011 | Teramoto | G01R 19/00 324/76.11 |

FOREIGN PATENT DOCUMENTS

| | | |
|---|---|---|
| JP | 4-83175 A | 3/1992 |
| JP | 2004-221160 A | 8/2004 |
| JP | 2004-225580 A | 8/2004 |
| JP | 2005-6472 A | 1/2005 |
| JP | 2005-93166 A | 4/2005 |
| JP | 2005-188973 A | 7/2005 |
| JP | 2011-3694 A | 1/2011 |
| JP | 2011-123080 A | 6/2011 |
| JP | 2011-205732 A | 10/2011 |

OTHER PUBLICATIONS

Kawasaki Nozomi; Connection Structure of current detecting resistor; Dec. 5, 2000; Yazaki Corp; JP2000-131350.*
Notification of transmittal of translation of the International Preliminary Report on Patentability for PCT/JP2014/067089 dated Jan. 28, 2016 [PCT/IB/338].
International Preliminary Report on Patentability for PCT/JP2014/067089 dated Jan. 19, 2016 [PCT/IB/373].
Written Opinion for Oct. 7, 2014 dated PCT/JP2014/067089 [PCT/ISA/237].
Search Report dated Oct. 7, 2014 issued by the International Searching Authority in counterpart International Patent Application No. PCT/JP2014/067089 (PCT/ISA/210).
Written Opinion dated Oct. 7, 2014 issued by the International Searching Authority in counterpart International Patent Application No. PCT/JP2014/067089 (PCT/ISA/237).
Communication dated Oct. 14, 2016 issued by the Japanese Patent Office in counterpart Japanese Patent Application No. 2013-149283.

* cited by examiner

SHUNT RESISTANCE TYPE CURRENT SENSOR

CROSS REFERENCE TO RELATED APPLICATIONS

This application is a continuation of PCT application No. PCT/JP2014/067089, which was filed on Jun. 26, 2014 based on Japanese Patent Application (No. 2013-149283) filed on Jul. 18, 2013, the contents of which are incorporated herein by reference.

BACKGROUND OF THE INVENTION

1. Field of the Invention

One or more embodiments of the present invention relate to a shunt resistance type current sensor.

2. Description of the Related Art

There has been proposed a shunt resistance type current sensor in which current to be measured flows into a shunt resistor having a known resistance value in order to detect a pulse current, a large AC current or the like, and a voltage drop generated across the shunt resistor is detected, thereby measuring a magnitude of the current to be measured. For example, in a vehicle such as an automobile, a metal piece called a bus bar is sometimes used for power distribution, and a part of the bus bar corresponding to a current path is utilized as a shunt resistor. A circuit board is disposed so as to oppose the bus bar. In order to detect a magnitude of the current to be measured flowing through the bus bar, the circuit board mounts a voltage detection IC for detecting a magnitude of voltage applied to the shunt resistor.

A patent literature 1 discloses a current sensor which is configured to include a bus bar interposed in a current path acting as a measuring subject, and a circuit board in which a circuit for current measurement is incorporated, and to utilize pin-like members as connection terminals between the bus bar and the circuit board. In this current sensor, the pin-like member is erected on the circuit board and a tip side of the connection terminal penetrates the circuit board, and thus the bus bar and the circuit board are electrically and mechanically connected.

On the other hand, as the method according to the patent literature 1 uses the pin-like members provided separately, this method may result in cost-up and increase of the number of assembling processes. Thus, a method of integrally forming the connection terminals themselves with the bus bar is also considered.

The patent literature 1 is JP-A-2005-188973.

SUMMARY OF THE INVENTION

In a case of using a bus bar as a battery terminal, current of several hundred amperes such as current during a cranking period flows into the bus bar. In view of this, the bus bar is required to be prepared to have a low resistance. However, in this case, generally a plate thickness of the bus bar becomes 1 mm or more. Thus, in a case of integrally forming connection terminals with the bus bar, the connection terminals become thick according to the plate thickness of the bus bar. As a result, following problems may be raised in a case of penetrating the connection terminals through a circuit board. Firstly, as large through holes are required on the circuit board side, the circuit board is required to have a sufficient space corresponding to these through holes. Secondly, as a degree of temperature drop due to heat dissipation of the connection terminals is large, a soldering work to the circuit board is difficult. Thirdly, if a difference in thermal expansion is generated between the bus bar and the circuit board, as the connection terminals are unlikely deformed, a stress cannot be relieved, therefore, reliability may degrade due to generation of cracks in soldered parts.

The embodiments of the invention are made in view of the aforesaid circumstances and an object of thereof is to provide a shunt resistance type current sensor which can perform connection between a connection terminal and a circuit board satisfactorily while integrally forming the connection terminal with a bus bar.

The aforesaid object of the embodiments of the invention is attained by the following configurations.

(1) A shunt resistance type current sensor, including:
a bus bar of a substantially flat plate shape;
a circuit board which is disposed so as to oppose the bus bar;
a connection terminal which electrically connects between the bus bar and the circuit board; and
a voltage detector which is mounted on the circuit board and detects a voltage applied to the bus bar in order to detect a magnitude of current to be measured flowing through the bus bar, wherein
the connection terminal is formed integrally with the bus bar as an extending piece extended from an edge part of the bus bar, an area of the connection terminal reduced in its plate thickness than that of the bus bar is set in a predetermined range from a tip side of the connection terminal, and the tip side of the connection terminal penetrates the circuit board and thus the connection terminal is connected to the circuit board.

(2) The shunt resistance type current sensor described in (1), wherein the connection terminal is bent to the circuit board side at a position deviated from the predetermined range in which the plate thickness is reduced.

(3) The shunt resistance type current sensor described in (1) or (2), wherein the connection terminal is configured of:
a base part which is formed to have a plate thickness same as a plate thickness of the bus bar and have a first width, and
a tip part which is formed to have a plate thickness reduced than the plate thickness of the bus bar and a second width smaller than the first width, and
the connection terminal is bent to the circuit board side within the base part and the tip part penetrates the circuit board.

(4) The shunt resistance type current sensor described in (1), wherein the connection terminal is bent to the circuit board side at a position within the predetermined range in which the plate thickness is reduced.

(5) The shunt resistance type current sensor described in (4), wherein the predetermined range is set to the entire area from the tip side to the edge part of the bus bar.

According to the embodiments of the invention, in the predetermined range from the tip side of the connection terminal, the area reduced in its plate thickness than that of the bus bar is set, and then the tip side of the each connection terminal penetrates the circuit board. Thus, as the circuit board side does not require large through holes, the circuit board is not required to have a large space. Further, as heat dissipation of the each connection terminal can be made small, such a problem that a soldering work to the circuit board is difficult can be suppressed. Furthermore, as the connection terminal is easily deformed, a stress can be relieved even if a difference in thermal expansion is generated between the bus bar and the circuit board. Thus, degradation in reliability such as generation of cracks in soldered parts can be suppressed. In this manner, the connection between the connection terminal and the circuit board can be performed satisfactorily while integrally forming the connection terminals with the bus bar.

DETAILED DESCRIPTION OF THE EXEMPLARY EMBODIMENTS

Figure 1:
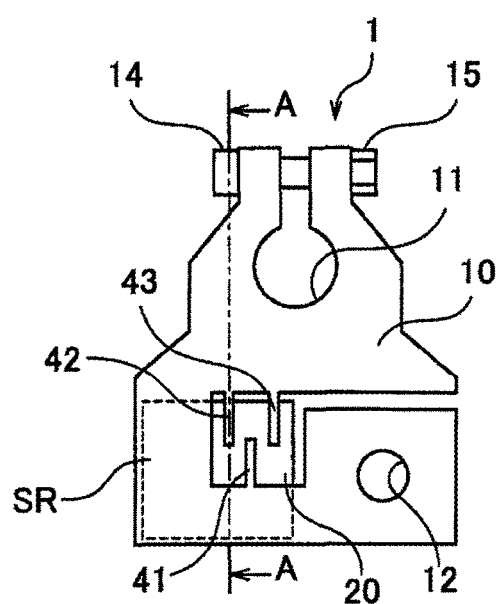
FIG. 1 is a top view schematically showing a shunt resistance type current sensor according to a first embodiment.
Figure 2:
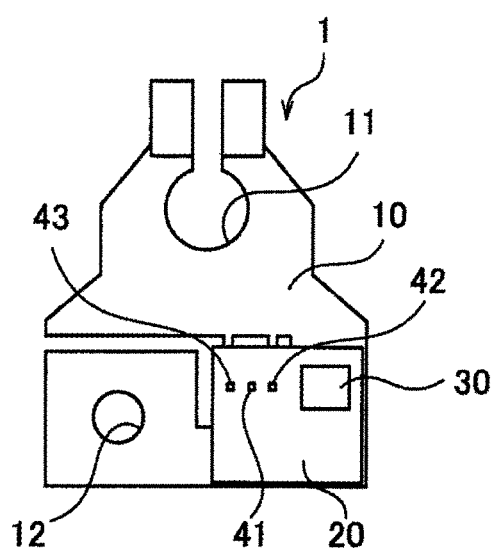
FIG. 2 is a bottom view schematically showing the shunt resistance type current sensor according to the first embodiment.
Figure 3:
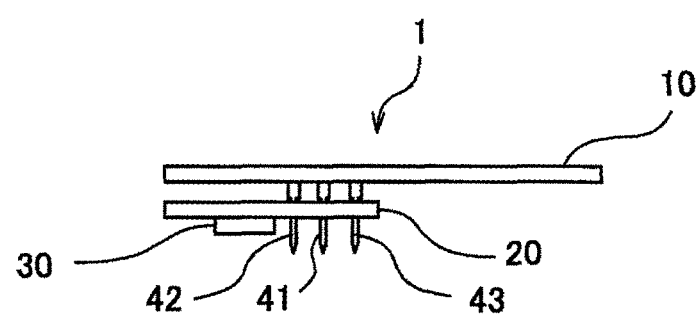
FIG. 3 is a side view schematically showing the shunt resistance type current sensor shown in FIG. 1.

FIG. 1 is a top view schematically showing a shunt resistance type current sensor 1 according to an embodiment. FIG. 2 is a bottom view schematically showing the shunt resistance type current sensor 1 according to the embodiment. FIG. 3 is a side view schematically showing the shunt resistance type current sensor 1 shown in FIG. 1 and shows a state of the shunt resistance type current sensor 1 shown in FIG. 1 seen from a lower side of the sheet. The shunt resistance type current sensor 1 is used as a battery terminal and mainly configured of a bus bar 10 and a circuit board 20.

The bus bar 10 is a conductive member of a substantially flat plate shape and constituted of, for example, copper-manganese alloy, copper-nickel-alloy or the like. A part of the bus bar 10 can be acted as a shunt resistance part SR. The bus bar is configured in a manner that current to be measured flows in the shunt resistance part SR when current flows in the bus bar 10. The bus bar 10 is formed to have a desired shape by press-working a plate-shaped steel.

In this embodiment, the bus bar 10 is formed in, for example, substantially U-shaped. The shunt resistance part SR is located at a center of the bus bar. Through holes 11 and 12 are formed at both end sides of the bus bar, respectively. The one through hole 11 acts as a hole for a battery post and the other through hole 12 acts as a hole for fixing a wire harness.

The shunt resistance type current sensor 1 includes a pair of voltage detection terminals 41 and 42 corresponding to positive and negative electrodes, respectively. Each of the voltage detection terminals 41 and 42 electrically connects between the circuit board 20 and the bus bar 10 and also mechanically connects the circuit board 20 to the bus bar 10. In a case that the bus bar 10 is used as the battery terminal and attached to the battery post on the negative electrode side of a battery, the one voltage detection terminal 41 corresponds to a voltage detection terminal of the positive electrode side and the other voltage detection terminal 42 corresponds to a voltage detection terminal of the negative electrode side. The voltage detection terminals 41 and 42 are provided at positions corresponding to both ends of the shunt resistance part SR, respectively.

In this embodiment, each of the voltage detection terminals 41 and 42 is configured as a belt-shaped extending piece extended from a corresponding edge part of the bus bar 10. The voltage detection terminals 41 and 42 are alternatively extended in opposite directions from the respective edge parts so as to oppose to each other and be juxtaposed in parallel. The voltage detection terminals 41 and 42 are formed integrally with the bus bar 10 in a manner of being formed simultaneously with the bus bar 10 by the press work. The voltage detection terminals 41 and 42 have corresponding configurations. Hereinafter, explanation will be made as to the voltage detection terminal 42 as an example.

Figure 4:
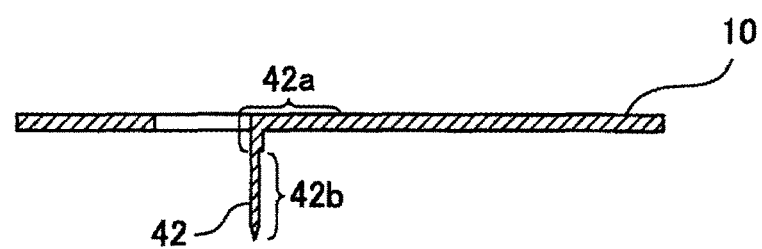
FIG. 4 is a sectional view schematically showing a bus bar.

FIG. 4 is an explanatory diagram schematically showing a section of the bus bar 10 along line A-A in FIG. 1. The voltage detection terminal 42 is configured in a manner that the edge part of the bus bar 10 is extended and then bent to the circuit board 20 side. That is, the voltage detection terminal is configured in substantially L-shaped. A tip side part of this terminal to the bent position is extended linearly and penetrates the circuit board 20 to thus connect with the circuit board 20 (see FIG. 2).

Specifically, the voltage detection terminal 42 is configured of a base part 42a connected to the bus bar 10 and a tip part 42b located at a tip of the base part 42a. The base part 42a has a plate thickness same as that of the bus bar 10 and is set to have a width (width in a direction orthogonal to the extending direction of the terminal) substantially same as the plate thickness of the base part 42a. The base part 42a is bent in the middle thereof to the circuit board 20 side. On the other hand, the tip part 42b is set to have a plate thickness smaller than that of the bus bar 10, that is, the base part 42a. Further, the tip part is set to have a width substantially same as the plate thickness of the tip part 42b, that is, to have a width smaller than that of the base part 42a. The tip part 42b penetrates the circuit board 20. The tip part 42b is configured in such a manner that the belt-shaped extending piece extended from the edge part of the bus bar 10 is formed and then the extending piece is subjected to a thickness reducing work for reducing the plate thickness thereof with respect to a predetermined range from the tip side thereof. The details of this work will be explained later.

As an inner diameter of the through hole formed at the circuit board 20 matches to an outer diameter of the tip part 42b, only the tip part 42b penetrates the circuit board 20 but the base part 42a cannot enter into the through hole. Thus, in between the bus bar 10 and the circuit board 20, there is a gap of a length from the base part 42a to the tip part 42b at the bent position. In this manner, the voltage detection terminal 42 connects to the circuit board 20 separated with the bus bar 10.

The shunt resistance type current sensor 1 further includes a ground terminal 43. The ground terminal 43 electrically connects between the bus bar 10 and the circuit board 20, and further, like the pair of voltage detection terminals 41 and 42, mechanically connects the circuit board 20 to the bus bar 10. This ground terminal 43 is disposed outside than the pair of voltage detection terminals 41 and 42 with respect to a current path of current flowing through the bus bar 10. In other words, the ground terminal 43 is disposed outside than the shunt resistance part SR. In this embodiment, the ground terminal 43 is provided between the other voltage detection terminal 42 and the through hole 11 for the battery post.

The ground terminal 43 is configured as a belt-shaped extending piece extended from an edge part of the bus bar 10 in a manner that the edge part of the bus bar 10 is extended and then bent to the circuit board 20 side, and a tip area thereof penetrates the circuit board 20 (see FIG. 2). As concrete configuration of the ground terminal 43 is substantially same as that of the voltage detection terminals 41 and 42, detailed explanation thereof will be omitted.

With reference to FIGS. 1 to 3 again, the circuit board 20 is disposed so as to oppose the bus bar 10 with a predetermined space therebetween. A pair of circuit patterns (not shown) are formed on the circuit board 20. Respective end portions of one of the pair of circuit patterns are connected to the voltage detection terminals 41 and 42 each penetrating the circuit board 20. Respective end portions of the other of the pair of circuit patterns are connected to a voltage detection IC 30 described later. Further, a ground pattern (not shown) is formed on the circuit board 20. One end portion of the ground pattern is connected to the ground terminal 43 which penetrates the circuit board 20, and the other end thereof is connected to the voltage detection IC 30. Each of connection between the respective voltage detection terminals 41, 42 and the circuit pattern and connection between the ground terminal 43 and the ground pattern is performed, for example, by soldering.

The voltage detection IC 30 is mounted on the circuit board 20 and connected to the circuit pattern and the ground pattern each formed on the circuit board 20. A microcomputer mainly configured of a CPU, an ROM, an RAM and an I/O interface can be used as the voltage detection IC 30. In order to detect a magnitude of current to be measured flowing through the bus bar 10, the voltage detection IC 30 (voltage detector) detects a voltage applied to the bus bar 10 as a voltage applied to the circuit board 20 via the pair of voltage detection terminals 41, 42. That is, the voltage detection IC 30 detects a voltage drop generated across the shunt resistance part SR of the bus bar 10 and then detects the measured current flowing through the bus bar 10 based on the voltage drop.

Figure 5:
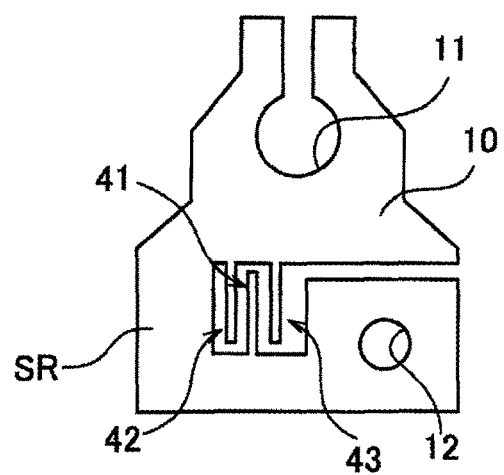
FIG. 5 is an explanatory diagram schematically showing a fabrication method of the bus bar.

FIGS. 5 to 8 are explanatory diagrams showing a fabrication method of the bus bar 10 used for the shunt resistance type current sensor 1. Firstly, as shown in FIG. 5, the bus bar 10, the voltage detection terminals 41, 42 and the ground terminal 43 are integrally formed by press-working the plate-shaped steel. Each of the voltage detection terminals 41, 42 and the ground terminal 43 is formed as the extending peace extended from the corresponding edge part of the bus bar 10 and set to have a width substantially same as the plate thickness of the bus bar 10.

Figure 6:
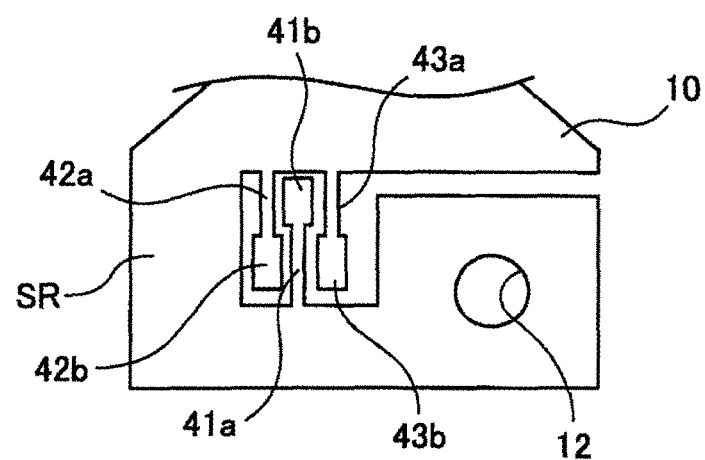
FIG. 6 is an explanatory diagram schematically showing the fabrication method of the bus bar.

Then, as shown in FIG. 6, each of the terminals 41, 42 and 43 is subjected to a press work for reducing the plate thickness thereof, with respect to a predetermined range from the tip side thereof, that is, corresponding one of the tip parts 41b, 42b and a tip part 43b. The plate thicknesses of the tip parts 41b, 42b and 43b are set to be smaller than the plate thicknesses of the base parts 41a, 42a and a base part 43a by this press work (thickness reducing work), respectively. The widths of the tip parts 41b, 42b and 43b after this press work become larger than those of the base parts 41a, 42a and 43a, respectively.

Figure 7:
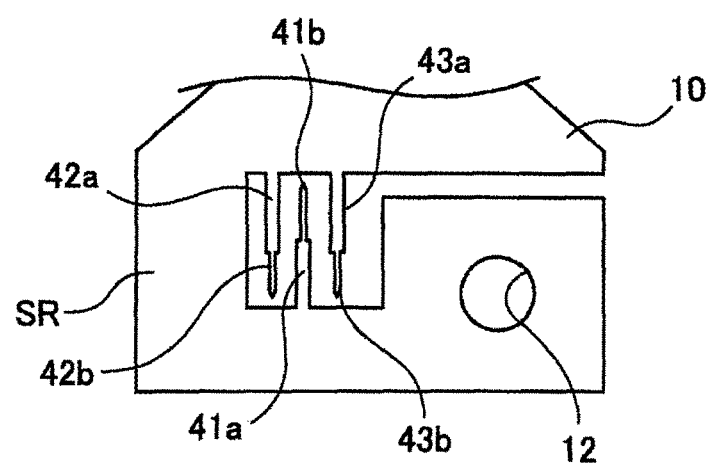
FIG. 7 is an explanatory diagram schematically showing the fabrication method of the bus bar.

Thus, as shown in FIG. 7, each of the tip parts 41b, 42b and 43b is subjected to a press work, and thus an excessive area thereof is removed. In this case, the width of each of the tip parts 41b, 42b and 43b is set to be substantially same as the plate thickness thereof after the thickness reducing work.

By doing so, the widths of the tip parts 41b, 42b and 43b are set to be smaller than the widths of the base parts 41a, 42a and 43a, respectively. Incidentally, a method of reducing the widths of the tip parts 41b, 42b and 43b is not limited to the press work but may be realized by a cutting work or the like.

Figure 8:
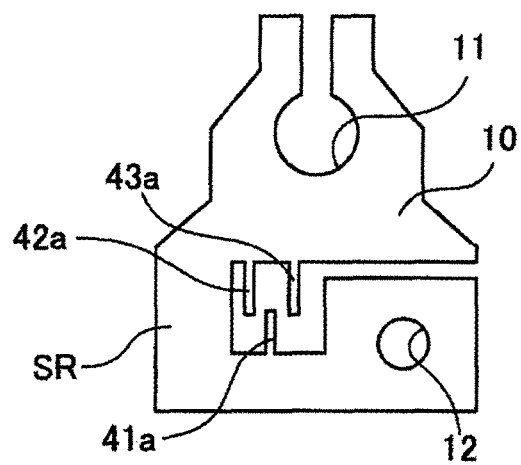
FIG. 8 is an explanatory diagram schematically showing the fabrication method of the bus bar.

Next, as shown in FIG. 8, in order to realize connection with the circuit board 20, the terminals 41, 42 and 43 are subjected to the bending works of bending the base parts 41a, 42a and 43a in the middle thereof, respectively. In other words, the bent positions of the terminals 41, 42 and 43 are set to the base parts 41a, 42a and 43a, respectively. As described above, as each of the tip parts 41b, 42b and 43b is subjected to the thickness reducing work, work hardening is occurred therein. In view of this, the bent position is set to each of the base parts 41a, 42a and 43a so as to perform the bending work at a position deviated from the work hardened area.

The bus bar 10 used in the shunt resistance type current sensor 1 is fabricated in this manner through a series of these processes.

Figure 9:
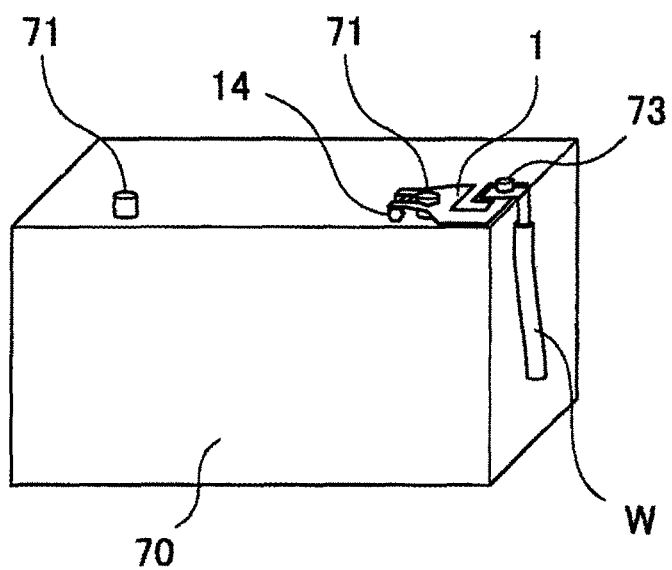
FIG. 9 is an explanatory diagram schematically showing a using state of the shunt resistance type current sensor.

FIG. 9 is an explanatory diagram schematically showing a using state of the shunt resistance type current sensor 1 according to the embodiment. The bus bar 10 of the shunt resistance type current sensor 1 according to the embodiment is used as the battery terminal usable for a battery 70. For example, the one through hole 11 of the bus bar 10 is connected to the negative electrode side of a battery post 71 by means of a bolt 14 and a nut 15 (see FIG. 1). Further, the other through hole 12 is connected to a wire harness W via a wire-harness fixing screw 73.

In this manner, the shunt resistance type current sensor 1 according to the embodiment includes the bus bar 10, the circuit board 20 disposed so as to oppose the bus bar 10, the connection terminals which electrically connect between the bus bar 10 and the circuit board 20, and the voltage detection IC 30 which is mounted on the circuit board 20 and detects a voltage applied to the bus bar 10 in order to detect a magnitude of the current to be measured flowing through the bus bar 10. Each of the connection terminals is formed integrally with the bus bar 10 as the extending piece extended from the corresponding edge part of the bus bar 10. An area of the each connection terminal reduced in its plate thickness than that of the bus bar 10 is set in the predetermined range from the tip side thereof. The tip side of the each connection terminal penetrates the circuit board 20, and thus the each connection terminal is connected to the circuit board 20. In this embodiment, the connection terminals correspond to the pair of voltage detection terminals 41, 42 and the ground terminal 43.

In this manner, according to the embodiment, the area reduced in its plate thickness than that of the bus bar 10 is set in the predetermined range from the tip side of the connection terminal, and then the tip side of the connection terminal penetrates the circuit board 20. Thus, as the circuit board 20 side does not require large through holes, the circuit board 20 is not required to have a large space. Further, as heat dissipation of the connection terminal can be made small, such a problem that a soldering work to the circuit board 20 is difficult can be suppressed. Furthermore, as the connection terminal is easily deformed, a stress can be relieved even if a difference in thermal expansion is generated between the bus bar 10 and the circuit board 20. Thus, degradation in reliability such as generation of cracks in soldered parts can be suppressed. In this manner, the connection between the connection terminals and the circuit board 20 can be performed satisfactorily while integrally forming the connection terminals with the bus bar 10.

Further, in this embodiment, the connection terminal is configured of the base part formed to have the plate thickness same as that of the bus bar 10 and have a first width, and the tip part formed to have the plate thickness reduced than that of the bus bar 10 and a second width smaller than the first width. The connection terminal is bent to the circuit board 20 side within the base part and the tip part penetrates the circuit board 20.

In a case of forming the tip part by performing the thickness reducing work for reducing the plate thickness, work hardening is occurred in the tip part. In a case of integrally forming the bus bar 10 and the connection terminal, the bending work is required for the connection terminal in order to perform connection to the circuit board 20. In this case, if the thickness reducing work is performed over the entirety of the connection terminal, the bending work is required to be performed in view of the work hardening. However, as the connection terminal is distinguished into the base part and the tip part and then the thickness reducing work is performed selectively, the bending work of the connection terminal can be realized easily.

Figure 10:
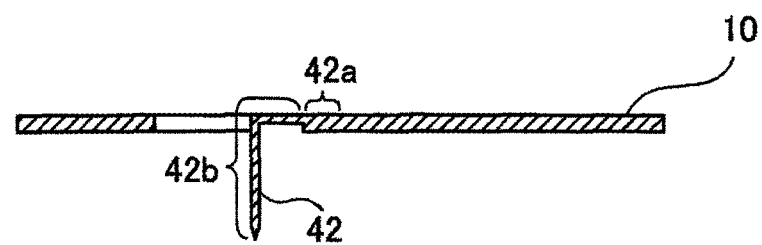
FIG. 10 is a sectional view schematically showing a bus bar.

In this respect, in this embodiment, the bent position at which the connection terminal is bent to the circuit board side is set at the base part (that is, a position deviated from the predetermined range in which the plate thickness is reduced). However, as shown in FIG. 10, the bent position may be set at the tip part (that is, a position within the predetermined range in which the plate thickness is reduced) and the bending work may be performed at the tip part. According to the former method, the tip part cannot be set in a range exceeding the bent part. In contrast, according to the latter method, as the tip part can be set also in a range exceeding the bent part, a ratio of the tip part in the connection terminal increases.

According to this configuration, although bending workability may degrade as compared with the case of performing the bending work at the base part, another work mode capable of neglecting such the degradation may exist with a high probability. Further, a stress acting on a connection part between the circuit board and the each connection terminal can be effectively relaxed, advantageously. This is because, as the stress relaxation depends on the thickness difference between members, the tip part of which plate thickness is reduced than that of the base part is likely deformed and hence effective for the stress relaxation.

Incidentally, in this embodiment, the connection terminal is configured of the base part and the tip part, and the area which plate thickness is reduced is set in the predetermined range from the tip side. However, the predetermined range (tip part) may be set to the entire area from the tip side to the edge part of the bus bar, without providing the base part. By doing so, a stress acting on the connection part between the circuit board and the connection terminal can be relaxed more effectively.

Herein the features of the embodiment of the shunt resistance type current sensor according to the invention described above will be briefly summarized and listed below in [1] to [5].

[1] A shunt resistance type current sensor (1), including:
a bus bar (10) of a substantially flat plate shape;
a circuit board (20) which is disposed so as to oppose the bus bar (10);
a connection terminal which electrically connects between the bus bar (10) and the circuit board (20); and
a voltage detector (voltage detection IC 30) which is mounted on the circuit board (20) and detects a voltage applied to the bus bar in order to detect a magnitude of current to be measured flowing through the bus bar (10), wherein
the connection terminal is formed integrally with the bus bar (10) as an extending piece extended from an edge part of the bus bar (10), an area of the connection terminal reduced in its plate thickness than that of the bus bar (10) is set in a predetermined range from a tip side of the connection terminal, and the tip side of the connection terminal penetrates the circuit board (20) and thus the connection terminal is connected to the circuit board (20).

[2] The shunt resistance type current sensor (1) described in [1], wherein the connection terminal is bent to the circuit board (20) side at a position deviated from the predetermined range in which the plate thickness is reduced.

[3] The shunt resistance type current sensor (1) described in [1] or [2], wherein each of the connection terminals is configured of;
a base part (41a, 42a) which is formed to have a plate thickness same as that of the bus bar (10) and have a first width, and
a tip part (41b, 42b) which is formed to have a plate thickness reduced than that of the bus bar (10) and a second width smaller than the first width, and
the connection terminal is bent to the circuit board (20) side within the base parts (41a, 42a) and the tip part penetrates the circuit board (20).

[4] The shunt resistance type current sensor (1) described in [1], wherein the connection terminal is bent to the circuit board (20) side at a position within the predetermined range in which the plate thickness is reduced.

[5] The shunt resistance type current sensor (1) described in [4], wherein the predetermined range is set to the entire area from the tip side to the edge part of the bus bar.

A detailed description has been given of the invention referring to the specific embodiment, but it will be understood by those skilled in the art that various changes and modifications can be made without departing from the spirit and scope of the invention.

According to the embodiments of the invention, the connection terminal can be connected to the circuit board satisfactorily while integrally forming the connection terminal with the bus bar. The invention which produces this advantageous effect is useful in a shunt resistance type current sensor.

What is claimed is:
1. A shunt resistance type current sensor, comprising:
a bus bar of a substantially flat plate shape;
a shunt resistance part provided in the bus bar;
a circuit board which is disposed so as to oppose the bus bar;
connection terminals which electrically connect between the bus bar and the circuit board; and
a voltage detector which is mounted on the circuit board and detects a voltage applied to the bus bar in order to detect a magnitude of current to be measured flowing through the bus bar, wherein
each of the connection terminals is formed integrally with the bus bar as an extending piece extended from an edge part of the bus bar and provided at respective positions corresponding to both ends of the shunt resistance part,
each of the connection terminals comprises a tapered tip end and an area having a reduced plate thickness set to be smaller than a plate thickness of the bus bar, the area of reduced plate thickness of each connection terminal extending along a predetermined length of each con- nection terminal beyond the tapered tip end of each connection terminal toward the bus bar, and the tapered tip end of the connection terminal penetrates the circuit board and thus the connection terminal is connected to the circuit board.

2. The shunt resistance type current sensor according to claim 1, wherein the connection terminal is bent to a circuit board side at a position deviated from the predetermined length in which the plate thickness is reduced.

3. The shunt resistance type current sensor according to claim 1, wherein the connection terminal is configured of;
a base part which is formed to have a plate thickness the same as the plate thickness of the bus bar and to have a first width, and
a tip part which is formed to have a reduced plate thickness set to be smaller than the plate thickness of the bus bar and to have a second width smaller than the first width, and
the connection terminal is bent to the circuit board side within the base part and the tip part penetrates the circuit board.

4. The shunt resistance type current sensor according to claim 1, wherein the connection terminal is bent to the circuit board side at a position within the predetermined length in which the plate thickness is reduced.

5. The shunt resistance type current sensor according to claim 4, wherein the predetermined length is set to an entire area from the tip side to the edge part of the bus bar.

* * * * *